United States Patent [19]

Augustine et al.

[11] Patent Number: 5,015,858

[45] Date of Patent: May 14, 1991

[54] THERMALLY ISOLATED FOCAL PLANE READOUT

[75] Inventors: Frank L. Augustine, Encinitas; Scott B. Evans, Carlsbad, both of Calif.

[73] Assignee: Hughes Aircraft Company, Los Angeles, Calif.

[21] Appl. No.: 500,633

[22] Filed: Mar. 27, 1990

[51] Int. Cl.[5] .................... G01J 5/06

[52] U.S. Cl. .................... 250/352; 250/332; 250/349

[58] Field of Search .................... 250/352, 370.08, 332, 250/338.2, 349

[56] References Cited

U.S. PATENT DOCUMENTS 4,740,700 4/1988 Shaham et al. .................... 250/332

4,815,199 3/1989 Jenner et al. .................... 250/338.2

*Primary Examiner*—Carolyn E. Fields
*Assistant Examiner*—Drew A. Dunn
*Attorney, Agent, or Firm*—W. C. Schubert; W. K. Denson-Low

[57] ABSTRACT

A focal plane array having an interconnect bump that has high thermal resistivity, and which may be used to interconnect the detector and readout of the array. The detector and readout each have separate heat sinks with separate temperature controls. The readout may thus be operated at a higher temperature than the detector. A high thermal resistance interconnect bump is employed to limit heat leakage from the readout to the detector to an acceptable level, and to enable a thermal gradient to be maintained simultaneously with a net savings in refrigerator power. The heat sink for the detector is made in such a way as to not obscure the active area of the detector, that is, it is annular in shape so as to surround the active area of the detector. The interconnect bump comprises a thermally insulating pedestal comprising a material such as polyimide, for example, with an over-the-edge metallization employed as an electrical contact. The pedestal employs perforating vias in order to increase the thermal resistance. Disposed on top of the pedestal is an indium bump which mates with a corresponding bump on the detector. A similar interconnect having a polyimide pedestal may also be provided on the detector to provide for even greater thermal resistance. The high thermal resistivity of the interconnect allows the detector and readout to operate at distinct optimal temperatures.

14 Claims, 3 Drawing Sheets

THERMALLY ISOLATED FOCAL PLANE READOUT

BACKGROUND

The present invention relates generally to focal plane array technology and, more specifically, to a thermally isolated focal plane array and interconnect structure.

A focal plane array comprises an array of infrared detectors, a cooling arrangement or refrigerator for cooling the detectors, and a readout arrangement for reading out the charge on the detectors. In conventional infrared focal plane arrays, the readout is connected to each detector by means of indium bump interconnects. These indium bump interconnects have a low thermal resistance. This requires the readout to operate at the same temperature as the detector, in fact, the readout acts as a heat sink for the detector. Since the readout must be maintained at or below a typical operating temperature of 10–20 degrees Kelvin, the noise tends to increase substantially as the readout temperature is lowered below the freezeout temperature of silicon, and the heat generated in the readout places a significant load on the refrigerator. Thus the performance of conventional focal plane arrays has been limited by readout noise and power dissipation.

A thermally insulating and electrically conductive interconnect has been developed by the assignee of the present invention that addresses the interconnection of pyroelectric focal plane arrays. This interconnect and the process of making the interconnect is described in U.S. Pat. No. 4,740,700 issued to Shaham et al., which patent is incorporated herein by reference.

Accordingly, it is a feature of the present ivention to thermally optimize a focal plane array. Another feature of the present invention is to reduce the amount of power used by a focal plane array, and thereby to reduce it weight. A further feature of the invention is to provide an improved focal plane array having a lower refrigerator capacity. A still further feature of the present invention is the provision of a focal plane array having lessened readout noise.

SUMMARY OF THE INVENTION

In accordance with these and other features of the invention, a focal plane array is provided having an interconnect bump that has high thermal resistivity, which may be used between the detector and readout of the array. Instead of using the readout as a heat sink for the detector, the detector and readout each has its own heat sink with its own temperature control. The readout may thus be operated at a higher temperature than the detector. A high thermal resistance interconnect bump is employed to limit heat leakage from the readout to the detector to an acceptable level, and to enable a thermal gradient to be maintained simultaneously with a net saving in refrigerator power. The heat sink for the detector is made in such a way as to not obscure the active area of the detector, that is, it is annular in shape so as to surround the active area of the detector.

The interconnect bump is made of indium and is disposed on top of a pedestal that comprises a patternable, thermally insulating material such as polyimide, having relatively good thermal insulating qualities with an over-the-edge metallization comprising an electrical contact. The basic structure is similar to that used in one specific conventional pyroelectric focal plane array, but embodies an enhancement, the use of perforating vias, in order to increase the thermal resistance. Disposed on top of the pedestal is a conventional indium bump which mates with a corresponding bump on the detector. A similar interconnect having a thermally insulating pedestal may also be provided on the detector to provide for even greater thermal resistance. The high thermal resistivity of the interconnect of the present invention allows the detector and readout of the focal plane array to operate at optimal temperatures.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
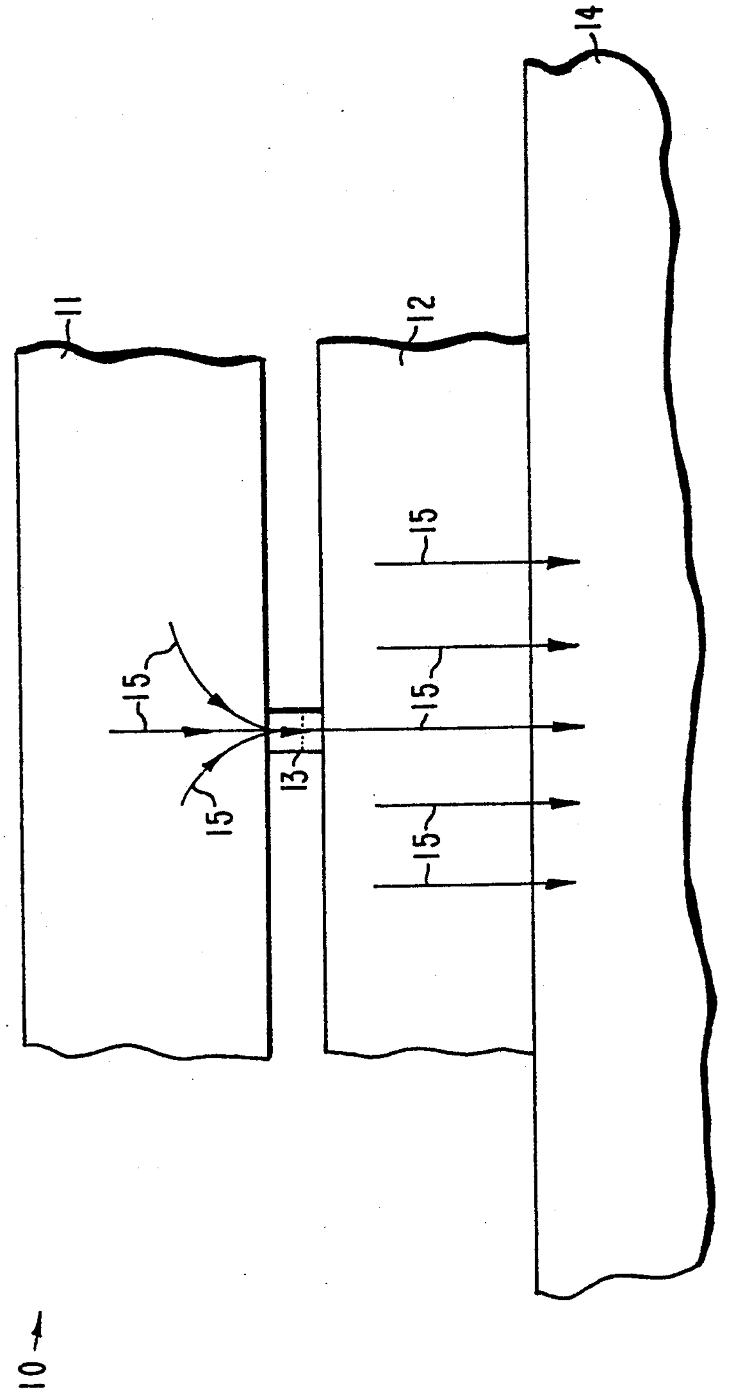
FIG. 1 is an enlarged side view of a slice through a conventional focal plane array showing a portion of a detector, a portion of a readout, and an indium bump interconnect therebetween.

Referring now to FIG. 1, there is shown an enlarged side view of a slice through a portion of a conventional focal plane array 10. FIG. 1 shows a portion of one detector 11 from the array 10 that comprises a plurality of such detectors 11. The detector 11 is a semiconductor device made of a material such as arsenic doped silicon (Si:As) or gallium doped silicon (Si:Ga), for example. The detector 11 normally detects infrared radiation, for example, from above as seen in FIG. 1. An electrical charge developed on the detector 11 is collected by a readout 12. In the conventional focal plane array 10, the charge is coupled from the detector 11 to the readout 12 by an indium bump interconnect 13.

Figure 2:
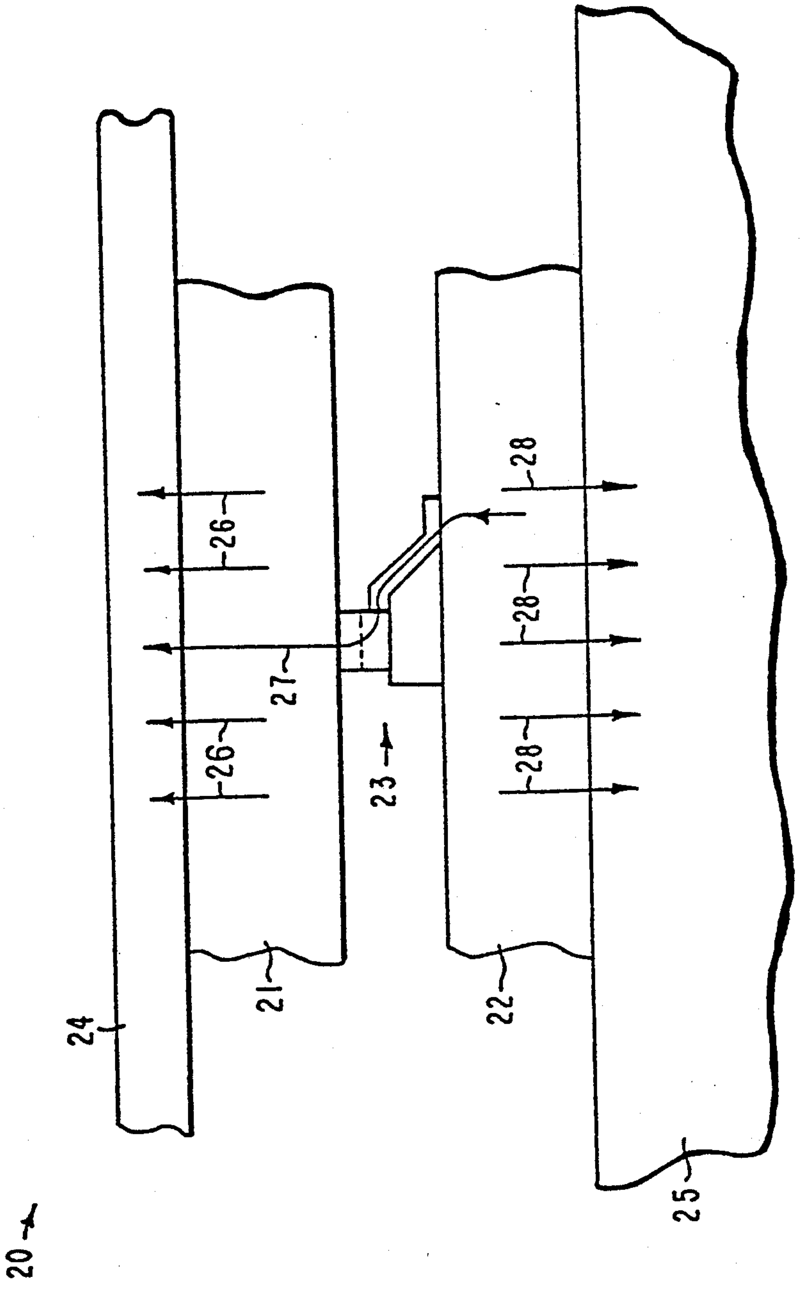
FIG. 2 is an enlarged side view of an interconnect structure constructed in accordance with the principles of the present invention.

Heat generated in the readout 12 is thermally coupled to the coldest stage of a refrigerator used to cool the focal plane array 10. FIG. 1 shows the readout 12 disposed on a readout heat sink 14, and the heat flow lines are indicated by arrows 15. The indium bump interconnect 13 that interconnects the detector 11 to the readout 12 has low thermal resistance. Accordingly, the detector 11, the indium bump interconnect 13 and the readout 12 all operate at substantially the same temperature. More particulary, the readout 12 acts as the heat sink for the detector 11. Typically, the desired operating temperature for the detector 11 is 10–20 degrees Kelvin. Unfortunately, this temperature is too cold for the readout 12 which typically provides optimum performance at a temperature above 40 degrees Kelvin. The noise generated by the readout 12 typically increases monotonically as the temperature thereof is decreased for temperatures below about 50 degrees Kelvin. Also, the heat generated by the readout 12 placed a significant load on the refrigerator. Thus, conventional interconnect arrangements as illustrated in FIG. 1 result in a focal plane array 10 that is limited by the noise and power dissipation of the readout 12. Referring now to FIG. 2, there is shown an improved focal plane array 20 constructed in accordance with the principles of the present invention. FIG. 2 is an enlarged side view of a slice through a portion of the focal plane array 20 showing a portion of a detector 21, a portion of a readout 22 and an interconnect 23 therebetween. In this embodiment of the invention, the array 20 has a separate detector heat sink 24 and a separate readout heat sink 25. The readout 22 is in intimate thermal contact with its heat sink 25, while the detector 21 is in intimate thermal contact with its heat sink 24. The detector heat sink 24 is made in such a way as to not obscure the active area of the detector 21, that is, the heat sink 24 is made annular in shape so as to surround the active area of the detector 21. Infrared radiation, for example, illuminates the detector 21 from the top as seen in FIG. 2.

Instead of using the readout 22 as the heat sink for the detector 21, both the detector 21 and readout 22 have their own heat sinks with their own temperature controls. The readout 22 may thus be operated at a higher temperature than the detector 21. Typically, the readout 22 is maintained at a temperature above 40 degrees Kelvin, while the detector 21 is maintained at about 10 degrees Kelvin.

Arrows 26 in FIG. 2 shown the heat flow the detector 21 to the detector heat sink 24. Arrow 27 shows the leakage heat flow from the readout 22 through the interconnect 23 and detector 21 to the detector heat sink 24. Arrows 28 show the heat flow from the readout 22 to the readout heat sink 25.

In accordance with the principles of the present invention, the interconnect 23 between the detector 21 and the readout 22 has a high thermal resistance to limit heat leakage from the readout 22 to the detector 21 to an acceptable level, and to enable a desired thermal gradient to be maintained. This feature permits a net savings in refrigerator power. The interconnect 23 is similar to the interconnect described in U.S. Pat. No. 4,740,700 issued to Shaham et al., entitled "Thermally Insulative and Electrically Conductive Interconnect and Process of Making Same." However, the interconnect of this patent is designed for use with pyroelectric detectors that are adapted to sense heat. Consequently, the interconnect disclosed herein in designed such that it does not efficiently remove heat from the pyroelectric detector. The present invention employs an interconnect 23 that is specifically adapted to adequately prevent heat transfer from the readout to the detector to which it is attached. This will be described in more detail below.

Figure 3A:
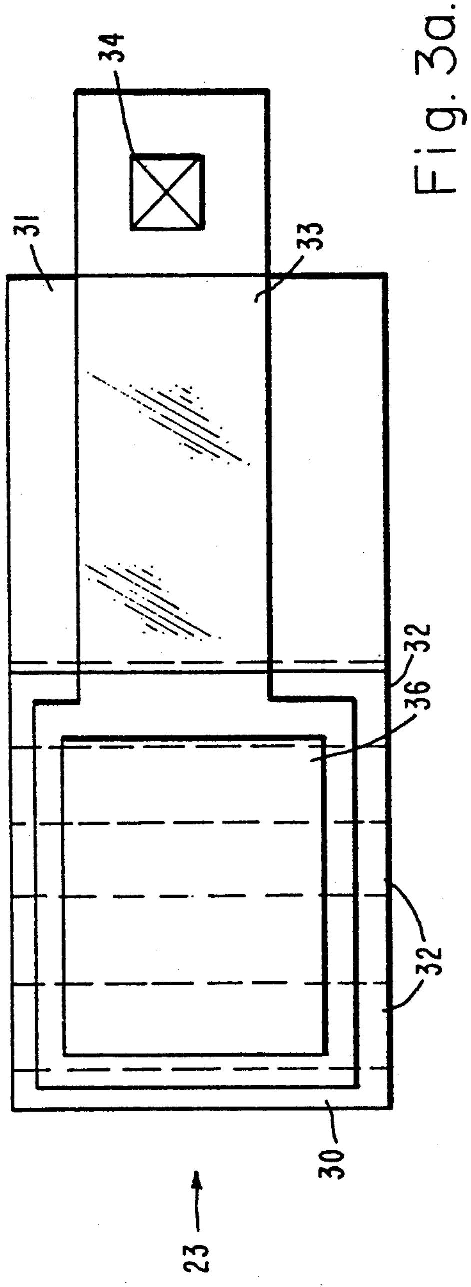
FIG. 3*a* is a greatly enlarged plain view of the interconnect structure shown in FIG. 2.
Figure 3B:
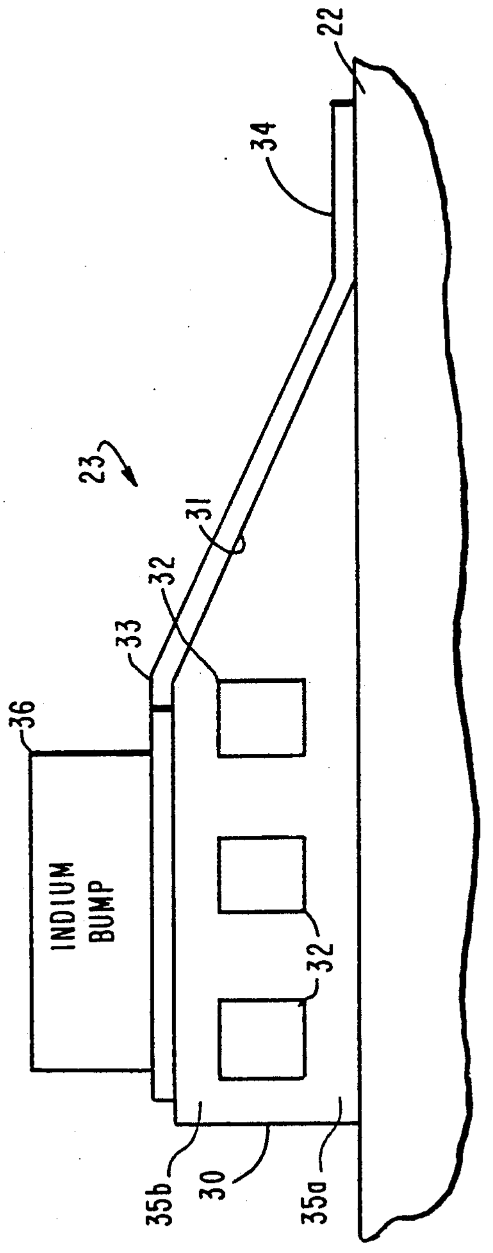
FIG. 3*b* is a greatly enlarged side view of the interconnect structure shown in FIGS. 2 and 3*a*.

Referring now to FIG. 3*a* and FIG. 3*b*, there is shown a greatly magnified and enlarged top view and side view, respectively, of the interconnect 23 illustrated in FIG. 2. This high thermal resistance interconnect 23 comprises a pedestal 30 disposed on the readout 22. One side of the pedestal 30 tapers or slopes as an inclined plane portion 31. The pedestal 30 is comprised of a patternable, thermally insulating material such as polyimide, for example. To increase the thermal resistance of the pedestal 30, it is provided with a plurality of perforating vias 32. Three such vias 32 are shown in FIGS. 3*a* and 3*b*, although more or less may be used, as appropriate. The vias 32 are in the main body of the pedestal 30, rather than in the inclined plane portion 31. The vias 32 are elongated tunnel-like perforations having a rectangular cross-section, although other geometric configurations and shapes may be used. The vias 32 extend completely through the polyimide pedestal 30 transverse to the direction of taper of the inclined plane portion 31. The vias 32 are generally aligned parallel to each other.

The vias are formed in the following manner. A first layer of polyimide 35*a*, for example, is deposited on the readout 22. A layer of metal (not shown) is then deposited on the layer of polyimide 35*a* and is patterned at the locations of the perforating vias 32. A second layer of polyimide 35*b* is then deposited on top of the patterned layer of metal and first layer of polyimide 35*a* which forms a generally rectangular structure having the metal surrounded by the layers of polyimide 35*a*, 35*b*. The second layer of polyimide 35*b* is then patterned to form the sloping inclined plane portion 31 of the pedestal 30. Finally, the metal is etched away to form the perforating vias 32 in the pedestal 30.

A layer 33 of over-the-edge metallization is applied to the top of the pedestal 30 and extending down the inclined plane portion 31 and onto the readout 22. Because of the taper of the inclined plane portion 31, the layer 33 of over-the-edge metallization is able to adhere evenly to the pedestal 30 and readout 22 without any breaks. A contact 34 is provided to make good electrical contact between the layer 33 of over-the-edge metallization and the readout 22. A conventional indium bump 36 is provided on the layer 33 of over-the-edge metallization above the top of the main body of the pedestal 30. The indium bump 36 mates with a corresponding bump on the detector.

Figure 4:
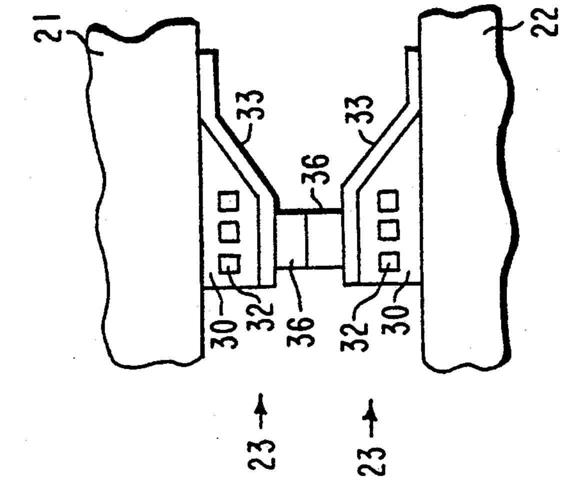
FIG. 4 illustrates a portion of an alternative embodiment of a focal plane array incorporating two cooperatively mating interconnect structures in accordance with the principles of the present invention.

In addition to the structure disclosed above, a similar interconnect structure having a thermally insulating pedestal may also be provided on the detector for even greater thermal resistance. FIG. 4 illustrates a portion of an alternative embodiment of the focal plane array 10 incorporating two cooperatively mating interconnects 23 in accordance with the principles of the present invention. The construction details of the interconnects 23 are as outlined above.

In the novel interconnect 23 of the present invention, a good electrical path is provided from the detector through the indium bump 36, down the layer 33 of the over-the-edge metallization, through the contact 34 and into the readout 22. However, the leakage heat flow from the readout 22 is slight as indicated by arrow 27 in FIG. 2 due to the high thermal resistivity of the interconnect 23.

Thus there has been described a new and improved interconnect for an infrared focal plane array. The high thermal resistivity of the present invention enables the readout of a focal plane array to operate at a higher temperature which is more desirable, while allowing the detector to operate at its optimum temperature. This results in less readout noise and power and weight savings. The readout is maintained at a higher temperature than in a conventional focal plane array. This reduces the required refrigerator capacity, thus effecting power and weight savings. Since readout noise typically increases monotonically as the temperature is decreased, for temperatures below about 50 degrees Kelvin, by operating the readout at a higher temperature than the 10–20 degrees Kelvin typical of arsenic doped silicon (Si:As) or gallium doped silicon (Si:Ga) detectors, the present invention provides for significant noise reduction.

It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Detecting apparatus comprising:
a detector;
a first temperature-controlled heat sink coupled to the detector;
a detector readout;
a second temperature-controlled heat sink coupled to the detector readout;
an electrically conductive, thermally nonconductive interconnect arrangement interconnecting the detector and detector readout.

2. The detecting apparatus of claim 1 wherein said interconnect arrangement comprises:
a thermally insulating pedestal disposed on the readout having a relatively flat top portion and a tapered portion extending from the top portion to one edge thereof and having a plurality of perforating vias extending transversely therethrough that provide thermal resistance;
conductive metallization disposed on the top and tapered portions of the pedestal and disposed on a portion of the readout; and
a bump interconnect disposed on the metallization on the top portion of the pedestal and coupled to a cooperating bump interconnect on the detector array.

3. The detecting apparatus of claim 2 wherein the bump interconnect comprises an indium bump interconnect.

4. The detecting apparatus of claim 2 wherein the thermally insulating pedestal comprises polyimide.

5. The detecting apparatus of claim 3 wherein the thermally insulating pedestal comprises polyimide.

6. A focal plane array comprising:
a detector array;
a detector heat sink attached to the detector array;
a detector readout;
a readout heat sink attached to the detector readout;
an interconnect arrangement disposed between the detector array and readout that comprises (a) a thermally insulating pedestal disposed on the readout having a relatively flat top portion and a tapered portion extending from the top portion to one edge thereof and having a plurality of perforating vias extending transversely therethough that provide thermal resistance, (b) conductive metallization disposed on the top and tapered portions of the pedestal and disposed on a portion of the readout, and (c) a bump interconnect disposed on the metallization on the top portion of the pedestal and coupled to a cooperating bump interconnect on the detector array.

7. The focal plane array of claim 6 wherein the bump interconnect comprises an indium bump interconnect.

8. The focal plane array of claim 6 wherein the thermally insulating pedestal comprises polyimide.

9. The focal plane array of claim 7 wherein the thermally insulating pedestal comprises polyimide.

10. The focal plane array of claim 6 which further comprises:
a second interconnect arrangement disposed between the detector array and readout that comprises (a) a thermally insulating pedestal disposed on the detector array having a relatively flat top portion and a tapered portion extending from the top portion to one edge thereof and having a plurality of perforating vias extending transversely therethrough that provide thermal resistance, (b) conductive metallization disposed on the top and tapered portions of the pedestal and disposed on a portion of the readout, and (c) a bump interconnect disposed on the metallization on the top portion of the pedestal and coupled to a cooperating bump interconnect on the readout.

11. The focal plane array of claim 10 wherein the bump interconnect comprises an indium bump interconnect.

12. The focal plane array of claim 10 wherein the thermally insulating pedestal comprises polyimide.

13. The focal plane array of claim 11 wherein the thermally insulating pedestal comprises polyimide.

14. A focal plane array comprising:
a detector array;
a detector heat sink attached to the detector array;
a detector readout;
a readout heat sink attached to the detector readout;
a first interconnect arrangement disposed between the detector array and readout that comprises
(a) a thermally insulating pedestal disposed on the readout having a relatively flat top portion and a tapered portion extending from the top portion to one edge thereof and having a plurality of perforating vias extending transversely therethrough that provide thermal resistance, (b) conductive metallization disposed on the top and tapered portions of the pedestal and disposed on a portion of the readout, and (c) a bump interconnect disposed on the metallization on the top portion of the pedestal and coupled to a cooperating bump interconnect on the detector array; and
a second interconnect arrangement disposed between the detector array and readout that comprises (a) a thermally insulating pedestal disposed on the detector array having a relatively flat top portion and a tapered portion extending from the top portion to one edge thereof and having a plurality of perforating vias extending transversely therethrough that provide thermal resistance, (b) conductive metallization disposed on the top and tapered portions of the pedestal and disposed on a portion of the readout, and (c) a bump interconnect disposed on the metallization on the top portion of the pedestal and coupled to a cooperating bump interconnect on the readout.

* * * * *